(12) United States Patent
Kawaguchi et al.

(10) Patent No.: US 8,519,880 B2
(45) Date of Patent: Aug. 27, 2013

(54) AD CONVERTER AND TD CONVERTER CONFIGURED WITHOUT OPERATIONAL AMPLIFIER AND CAPACITOR

(75) Inventors: Hiroshi Kawaguchi, Kobe (JP);
Masahiko Yoshimoto, Kobe (JP);
Toshihiro Konishi, Kobe (JP); Shintaro Izumi, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 13/470,605

(22) Filed: May 14, 2012

(65) Prior Publication Data

US 2012/0286987 A1 Nov. 15, 2012

(30) Foreign Application Priority Data

May 14, 2011 (JP) ................................. 2011-108910

(51) Int. Cl.
*H03M 1/50* (2006.01)

(52) U.S. Cl.
USPC .......................................... 341/166; 341/111

(58) Field of Classification Search
USPC ................................................. 341/111, 166
See application file for complete search history.

(56) References Cited

U.S. PATENT DOCUMENTS

| | | | |
|---|---|---|---|
| 7,332,973 B2 * | 2/2008 | Lee et al. | 331/25 |
| 7,872,602 B2 * | 1/2011 | Chen | 341/166 |
| 8,072,361 B2 * | 12/2011 | Henzler | 341/120 |
| 8,138,843 B2 * | 3/2012 | Straayer et al. | 331/57 |

OTHER PUBLICATIONS

Ying Cao et al., "A 1.7mW 11b 1-1-1 MASH ΔΣ Time-to-Digital Converter", Solid-State Circuits Conference Digest of Technical Papers (ISSCC), 2011 IEEE International, pp. 480-482, Feb. 23, 2011.
Matthew Z. Straayer et al., "A Multi-Path Gated Ring Oscillator TDC With First-Order Noise Shaping", IEEE Journal of Solid-State Circuits, vol. 44, No. 4, Apr. 2009, 10 pages.

* cited by examiner

*Primary Examiner* — Khai M Nguyen
(74) *Attorney, Agent, or Firm* — Wenderoth, Lind & Ponack, L.L.P.

(57) ABSTRACT

An AD converter includes a VT converter circuit part which inputs an analog input voltage and a sampling clock, converts the analog input voltage to a corresponding delay time, and outputs time domain data. A ring oscillator circuit part of N stages inputs the time domain data, and an error propagation circuit part takes out delay information containing a quantization error from phase information of the ring oscillator circuit part of the previous stage, and propagate the delay information to the ring oscillator circuit part of a subsequent stage. A counter circuit part measures a number of waves of an output oscillation waveform of the ring oscillator circuit part of each stage, and an output signal generator part generates an output signal from an output counted value of each counter circuit part. A reset part resets each error propagation circuit part and each counter circuit part with a sampling clock.

11 Claims, 15 Drawing Sheets

AD CONVERTER AND TD CONVERTER CONFIGURED WITHOUT OPERATIONAL AMPLIFIER AND CAPACITOR

BACKGROUND OF THE INVENTION

1. Field of the Invention

The present invention relates to an analog-to-digital converter (referred to as an AD converter hereinafter) and a time-to-digital converter (referred to as a TD converter hereinafter), which use operation in the time domain using neither any operational amplifier nor any switched capacitor estimated to be unsuitable for process scale shrinkage.

2. Description of the Related Art

For further developments of information communication apparatuses, it is absolutely indispensable to develop LSIs of less consumption power, higher performance and lower cost than in the conventional case. The performances of LSIs have been improved up to now in accordance with scale shrinkage of semiconductor manufacturing processes. The transistor count per chip has increased every year by virtue of scale shrinkage, and this makes it possible to actualize LSIs of higher performances.

However, in analog circuits such as operational amplifiers and switched capacitors, scale shrinkage has become more difficult due to the problems of dynamic range and non-linearity. In particular, under the environment of low supply voltages in advanced processes, the dynamic range is narrowed and the linearity is deteriorated, causing difficulties in securing gains.

Therefore, in a mixed-signal chip where a digital circuit and an analog circuit are mixed, the analog circuit block is a barrier to hinder the power consumption reduction and cost reduction. Moreover, upon configuring a mixed-signal chip, the digital circuit discriminates between "1" and "0" depending on whether the signal voltage is higher or lower than a reference value, and therefore, a configuration robust to variations in the device characteristics is possible. On the contrary to it, the analog circuit purely processes the signal waveform as it is, there is such a problem that degradation in the signal processing accuracy is incurred by variations in the device characteristics. The transistor size shrinks as the scale shrinkage of semiconductor processes progresses, and reductions in the power voltage progresses in accordance with the same situation. The variations in the device characteristics of individual transistors become large, and the problem of disadvantageously giving superfluous influences to the signal to be processed has become increased.

Various disincentive factors such as a reduction in the gain of the operational amplifier, a deterioration in the linearity, and a degradation in the SN ratio due to a reduction in the signal voltage amplitude caused by the lowered power voltage occur in accordance with the scale shrinkage of semiconductor processes, and it is getting more difficult to design the analog circuit part that configures the mixed-signal chip.

Under such a situation, regarding AD converters that are important components in mixed-signal chips to be applied to wireless communications, data sensing and the like, the AD converters, which have been conventionally difficult in being adapted to scale shrinkage because of the configuration employing operational amplifiers and accompanying capacitors, are driven toward operational amplifier-free capacitor-free configurations as a trend in recent years.

On the other hand, a TD converter (referred to as a TDC) for converting a delay value into a digital value has been known, and a Gated-Ring-Oscillator TDC (hereinafter, referred to as a "GRO TDC") as shown in FIG. 1 has been known as a TD converter that utilizes a ring oscillator.

In the case of the GRO TDC, a pulse width that temporally changes is inputted ($T_{in}$) to the GRO, and the width of the input pulse is quantized by counting the output oscillation waveform ($GRO_{out}$) of the GRO within the width of the input pulse, allowing the discretized digital data ($D_{out}$) to be obtained in a form of counted value.

That is, as shown in the operation concept diagram of the GRO TDC of FIG. 2, oscillation output ($GRO_{out}$) of the GRO is made while the input pulse ($T_{in}$) to the GRO is raised, and the value ($D_{out}$) obtained by counting the oscillation contains a quantization error (QN) taken out of the oscillation waveform of the GRO.

It has been known that the GRO TDC has a noise shaping characteristic of first-order Δ-Σ modulation (See the Non-Patent Document 1), whereas the conventional disclosure remains demonstrating a circuit configuration that has a first-order noise shaping function.

A prior art document related to the present invention is as follows:

Non-Patent Document 1: Matthew Z Straayer, et al., "A Multi-Path Gated Ring Oscillator TDC With First-Order Noise Shaping", IEEE JOURNAL OF SOLID-STATE CIRCUITS, Vol. 44, No. 4, April 2009.

It is difficult for the aforementioned GRO TDC, which utilizes the conventional ring oscillator, to improve the performance since it can obtain only the first-order noise shaping. Moreover, a configuration to obtain higher-order noise shaping in the voltage domain in combination with operational amplifiers in a manner similar to that of the conventional case has such a problem that it is unsuitable for a broad area, a high power consumption, and minute processes due to problems such as securing of operational amplifier performance and the like.

SUMMARY OF THE INVENTION

In view of the aforementioned circumstances, an object of the present invention is to provide an operational amplifier-less capacitor-less AD converter and TD converter capable of achieving higher-order noise shaping by propagating a quantization error in the time domain taking advantage of the noise shaping characteristic of Δ-Σ modulation.

In order to achieve the aforementioned object, the AD converter of the present invention has the following components:

(1) a VT converter circuit part configured to receive the inputs of an analog input voltage and a sampling clock (CK), convert the analog input voltage to a corresponding delay time, and output time domain data;

(2) a ring oscillator circuit part of a plurality of N stages configured to input the time domain data;

(3) an error propagation circuit part being inserted between the ring oscillator circuit part of the previous stage and a ring oscillator circuit part of the next stage, the error propagation taking out delay information containing a quantization error from phase information of the ring oscillator circuit part of the previous stage, and propagating the delay information to the ring oscillator circuit part of the subsequent stage;

(4) a counter circuit part configured to measure a number of waves of the output oscillation waveform of the ring oscillator circuit part of each stage;

(5) an output signal generator part configured to generate an output signal from the output counted value of each counter circuit part; and (6) a reset part configured to reset each error propagation circuit part and each counter circuit part with a sampling clock (CK).

According to the above configuration, an operational amplifier-less capacitor-less AD converter capable of propagating the quantization error and achieving higher-order noise shaping can be actualized.

In this case, (1) the VT converter circuit part is not to perform calculation by using an analog voltage value but to perform VT (Voltage to Time) conversion of data from the voltage domain to the time domain in order to perform calculation through conversion of the voltage value into a delay (time) value without using an operational amplifier of a large power consumption, i.e., to achieve operational amplifier-less calculation.

Moreover, (2) the ring oscillator circuit part is concretely configured to include a GRO (Gated Ring Oscillator) circuit. The GRO (Gated Ring Oscillator) circuit is a ring oscillator configured to include a gated inverter. The ring oscillator configured to include the gated inverter has a ring structure as a whole configured so that an odd number of inverters are employed, the output of each of the inverters is inputted to another inverter in a chain form, and the output of the inverter of the final stage is inputted to the inverter of the first stage. The chain of the odd number of inverters serves as the logical negation of the input as a whole. Since the inverters have a delay time, the inverter of the final stage outputs the logical negation after the delay time from the input to the inverter of the first stage. Then, this is inputted again to the inverter of the first stage. Oscillation is achieved by repeating these processes. By using the GRO circuit, the noise shaping characteristic of $\Delta$-$\Sigma$ modulation can be utilized.

Moreover, (3) the error propagation circuit part is configured to take out delay information containing a quantization noise (referred to as a quantization error) from the phase information of the ring oscillator circuit part of the previous stage and transmit the delay information to the ring oscillator circuit part of the subsequent stage. In concrete, the output oscillation waveform of the ring oscillator circuit part of the previous stage is supplied to the clock input of a flip-flop.

Moreover, (4) the counter circuit part is configured to input a pulse width as an analog input voltage that temporally changes to the ring oscillator circuit part and continuously count the output oscillation waveform of the ring oscillator circuit part within the interval of the pulse width, and this leads to quantization of the inputted analog input voltage and obtaining discretized digital data.

Moreover, (5) the output signal generator part is configured to generate an output signal by subjecting the output counted value of each counter circuit part to a subtraction process, and this is processed in a DSP (Digital Signal Processor) or the like. The output signal generator part includes non-linearity correction of a VT converter circuit described later.

Moreover, (6) the reset part is configured to reset each error propagation circuit part and each counter circuit part with the sampling clock (CK). It is noted that the output signal of the VT converter circuit part may be used instead of the sampling clock (CK).

In this case, the error propagation circuit part should more preferably be a Delay type flip-flop circuit. The quantization error is included in the output oscillation waveform of the GRO, and data containing the quantization error can be obtained by detecting the rise of the output oscillation waveform of the GRO of the previous stage using the Delay type flip-flop circuit.

Moreover, the output signal generator part should preferably have a decimation filter circuit and perform smoothing by subjecting the output signal to a decimation filter process.

Moreover, the VT converter circuit part is able to output time domain data from the output node of the inverter and concretely configured to include the following components:

(a) an inverter;

(b) first and second MOS transistors being inserted in parallel between the input node of the inverter and the reference voltage node, where a gate and a drain of the first MOS transistor are connected to each other, and a gate of the second MOS transistor is supplied with an input voltage signal; and (c) a third MOS transistor being inserted between the input node of the inverter and the power voltage node, where a gate of the third MOS transistor is supplied with the sampling clock (CK).

According to the VT converter circuit part configured as above, pulse wave data of which the pulse width changes analogously in accordance with the analog input voltage can be obtained.

It is the principle of operation that the first MOS transistor of which the gate and the drain are connected together and the second MOS transistor of which the gate is supplied with the input voltage signal serve as the power source side, and electric charges accumulated in the drain are pulled out. Electric charges are supplied when the sampling clock (CK) supplied to the gate of (c) the third MOS transistor is a Low level, and (a) the inverter outputs a Low level signal. When the sampling clock (CK) becomes a High level, and the supply of electric charges stops, electric charges are pulled out to the first MOS transistor side at a certain speed. The speed that the electric charges are pulled out to the second MOS transistor side changes depending on the input voltage signal supplied to the gate of the second MOS transistor, and the inverter outputs a High level signal when the voltage falls below the threshold value of the inverter. That is, the speed of pulling out the electric charges changes depending on the input voltage signal, and this leads to achievement of the VT conversion. Details are described with reference to circuit diagrams in the implemental examples described later.

Moreover, it is more preferable that the output signal generator part further includes a decimation filter circuit and a calibration circuit of the VT converter circuit part, and non-linearity correction is performed by using the calibration circuit for the output data after the decimation filter process by the output signal generator part.

Although the VT characteristic of the VT converter circuit part does not have complete linearity, the non-linearity correction is performed after the decimation filter process by utilizing its monotonous increase with respect to the input voltage. Moreover, a coefficient necessary for the non-linearity correction is preliminarily obtained by calibration.

Next, the TD converter of the present invention is configured to include the following components:

a ring oscillator circuit part of a plurality of N stages configured to input the time domain data;

an error propagation circuit part being inserted between the ring oscillator circuit part of the previous stage and the ring oscillator circuit part of the next stage, the error propagation circuit part taking out delay information containing a quantization error from the phase information of the ring oscillator circuit part of the previous stage, and propagating the delay information to the ring oscillator circuit part of the subsequent stage;

a counter circuit part configured to measure a number of waves of the output oscillation waveform of the ring oscillator circuit part of each stage;

an output signal generator part configured to generate an output signal from the output counted value of each counter circuit part; and a reset part configured to reset each error propagation circuit part and each counter circuit part at the input signal timing of the ring oscillator circuit part, and convert a delay time value into a digital value.

According to the above configuration, an operational amplifier-less capacitor-less TD converter capable of propagating the quantization error and performing higher-order noise shaping can be actualized.

In this case, the aforementioned error propagation circuit part is to detect the rise of the output oscillation waveform from the ring oscillator circuit part of the previous stage, obtain the time domain data containing the quantization error, and thereafter transmit the quantization error by subtracting the counted value of the number of waves of the output oscillation waveform of the ring oscillator circuit part of the previous stage, and should preferably be, in concrete, a Delay type flip-flop circuit. The quantization error is contained in the output oscillation waveform of the GRO, and data containing the quantization error can be obtained by detecting the rise of the output oscillation waveform of the GRO of the previous stage using the Delay type flip-flop circuit.

Moreover, the ring oscillator circuit part is, in concrete, a GRO (Gated Ring Oscillator) circuit that is a ring oscillator configured to include a gated inverter. By using the GRO circuit, the noise shaping characteristic of Δ-Σ modulation can be utilized.

The present invention has the effects of constructing the operational amplifier-less capacitor-less AD converter and TD converter capable of propagating the quantization error and performing higher-order noise shaping in the time domain.

According to the AD converter and the TD converter of the present invention, which are each configured to include a ring oscillator and a logic circuit, is therefore able to provide a configuration, which has a small area, low power consumption and is suitable for minute processes.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiment of the present invention is described in detail below with reference to the drawings. The scope of the present invention is limited to none of the following implemental examples and illustrative examples and allowed to be variously changed and deformed.

Figure 1:
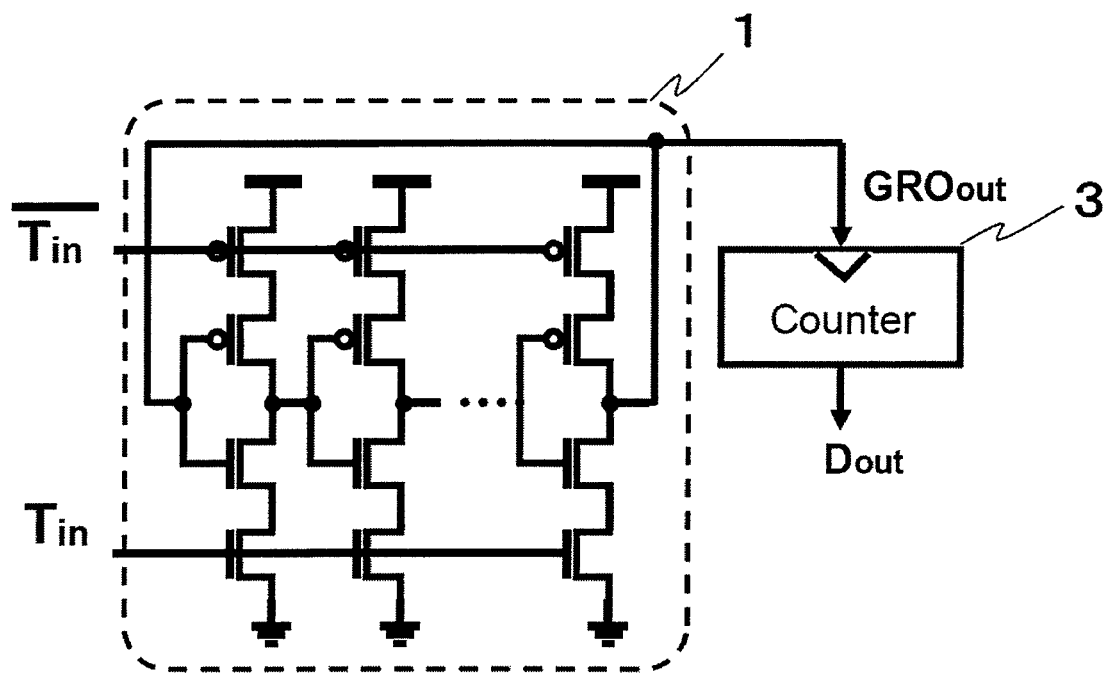
FIG. 1 is a circuit configuration diagram of a prior art GRO TDC.
Figure 2:
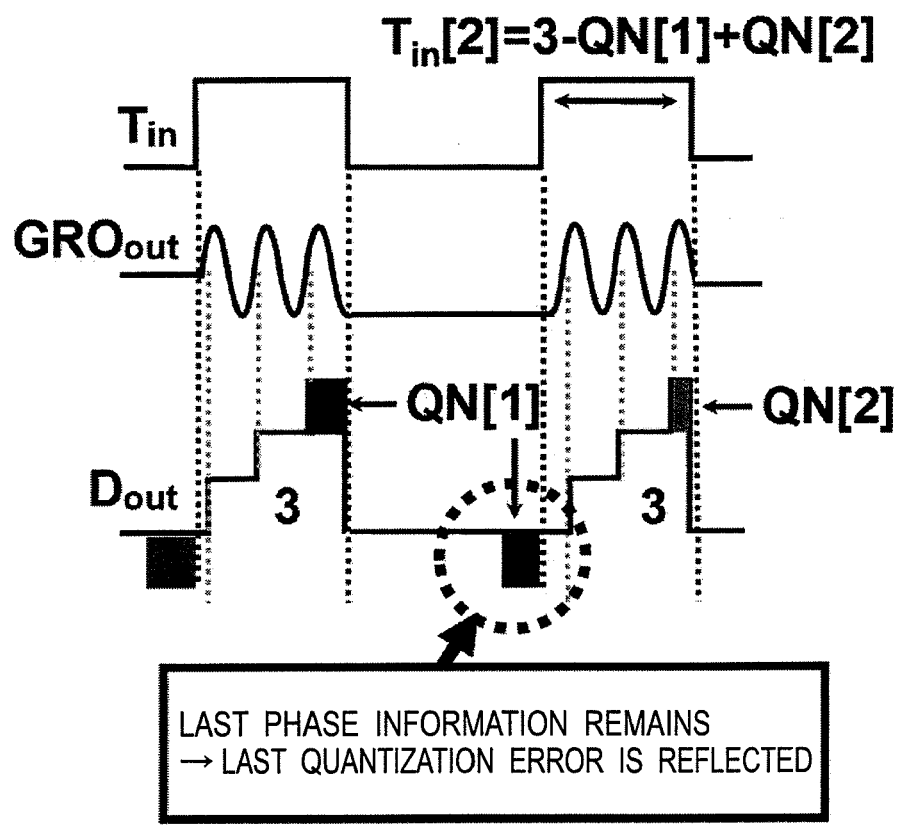
FIG. 2 is an operation concept diagram of the prior art GRO TDC.
Figure 3:
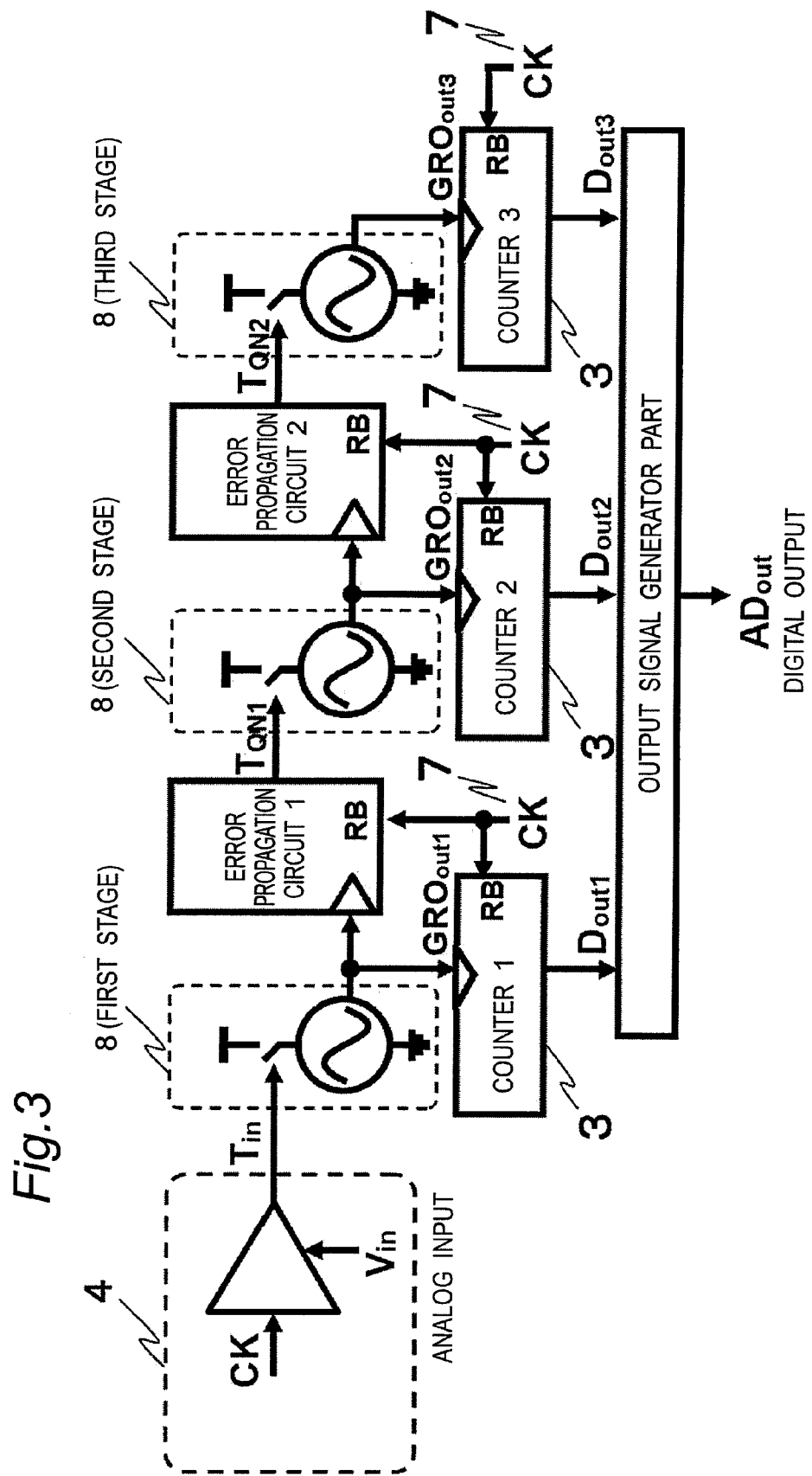
FIG. 3 is a functional block diagram of the AD converter of the present invention.
Figure 4:
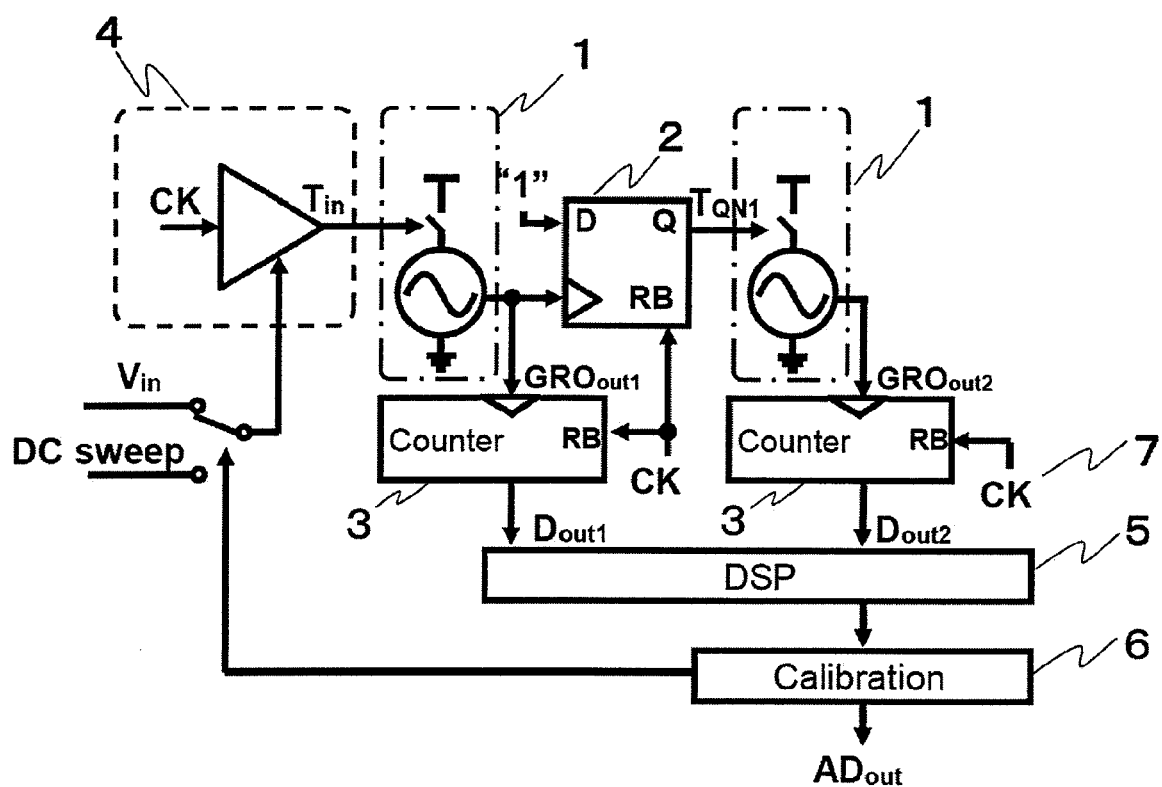
FIG. 4 is a circuit configuration diagram of the AD converter of the present invention.

FIG. 3 shows a functional block diagram of the AD converter of the present invention. FIG. 4 shows, in concrete, the circuit configuration diagram of one preferred embodiment of the AD converter of the present invention.

The AD converter shown in the functional block diagram of FIG. 3 has a VT converter circuit part 4 that receives the inputs of an analog input voltage and a sampling clock (CK), converts the analog input voltage to a corresponding delay time, and outputs time domain data, and has a ring oscillator circuit part of a plurality of N stages to which the time domain data is inputted. In this case, a ring oscillator circuit part 8 of three stages is provided.

Moreover, an error propagation circuit part 1 is inserted between the ring oscillator circuit part of the first stage and the ring oscillator circuit part of the second stage, and an error propagation circuit part 2 is inserted between the ring oscillator circuit part of the second stage and the ring oscillator circuit part of the third stage. The error propagation circuit part 1 takes out delay information containing a quantization error from the phase information of the ring oscillator circuit part of the first stage, and propagates the delay information to the ring oscillator circuit part of the second stage. Moreover, the error propagation circuit part 2 takes out delay information containing a quantization error from the phase information of the ring oscillator circuit part of the second stage, and propagates the delay information to the ring oscillator circuit part of the third stage.

In this case, it is preferable to utilize a GRO (Gated Ring Oscillator) for the ring oscillator circuit part.

Moreover, a counter circuit part 3 configured to measure a number of waves of the output oscillation waveform of the ring oscillator circuit part of each stage is provided. Then, there is an output signal generator part configured to generate an output signal from the output counted value of each counter circuit part 3.

Moreover, there is a reset part configured to reset each error propagation circuit part and each counter circuit part with the sampling clock (CK).

Next, a concrete circuit configuration diagram of an AD converter configured to include a GRO circuit part of two stages is shown in FIG. 4.

The AD converter shown in the circuit configuration diagram of FIG. 4 is configured to include the following:

a VT converter circuit part 4;

GRO circuit parts 1 of two stages configured to input the time domain data;

a Delay type flip-flop 2 that is inserted between the GRO circuit part 1 of the previous stage and the GRO circuit part 1 of the subsequent stage and operates as an error propagation circuit part configured to propagate the output oscillation waveform of the GRO circuit part 1 of the previous stage containing the quantization error;

counter circuit parts 3 configured to measure the numbers of waves of the output oscillation waveforms ($GRO_{out1}$, $GRO_{out2}$) of the GRO circuit parts 1;

a DSP (Digital Signal Processor) 5 configured to operate as an output signal generator part to generate an output signal from the output counted values ($D_{out1}$, $D_{out2}$) of the counter circuit parts 3;

a reset part 7 configured to reset the Delay type flip-flop 2 and two counter circuit parts 3 with the sampling clock (CK); and a calibration circuit 6 configured to perform non-linearity correction after a decimation filter process by the DSP 5.

The quantization error is contained in the output oscillation waveform of the GRO. By detecting the rise of the output oscillation waveform ($GRO_{out}$) from the first GRO by the Delay type flip-flop, data ($T_{QN}$) containing the quantization error (QN) is obtained. Subsequently, by subtracting the value ($D_{out}$) obtained by counting the oscillation, it is possible to transmit the quantization error. The delay information containing the quantization error (QN) taken out is to be inputted to the GRO placed in the next stage. Since the oscillation frequency $D_{out}$ of the $GRO_{out}$ is included in $T_{QN}$, it is necessary to subtract $D_{out}$ in order to take out only the quantization error (QN). Since $D_{out}$ is a digital value, it is proper to perform the subtraction process in the output signal generator part.

As described above, the GRO has the first-order Δ-Σ modulation characteristic, and the higher-order noise shaping effect can be obtained by transmitting the quantization error between the GROs by the Delay type flip-flop that operates as the error propagation circuit part.

Figure 5:
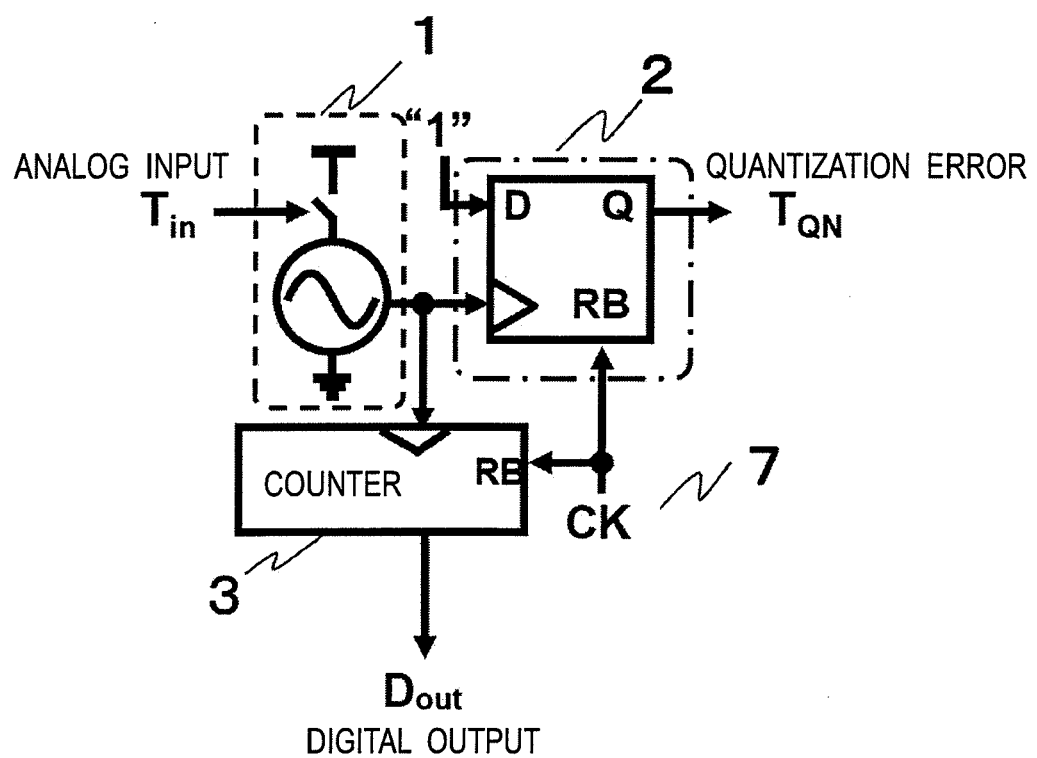
FIG. 5 is a first explanatory diagram of the error propagation circuit part.

The Delay type flip-flop that operates as the error propagation circuit part is further described with reference to FIGS. 5 and 6. As shown in FIG. 5, the signal state of the input D is fixed to "1" in this Delay type flip-flop, and therefore, the signal state of "1" is outputted as the output Q and held at the rise timing of the clock input. In the Delay type flip-flop, the output Q is held regardless of the state of the input D until the rise of the next clock is inputted.

Referring to FIG. 5, the output oscillation waveform ($GRO_{out}$) of the GRO is supplied to the clock input of the Delay type flip-flop. Therefore, the signal state of "1" is outputted as the output Q and held at the rise timing of the output oscillation waveform ($GRO_{out}$) of the GRO, and subsequently the output Q holds "1" until a reset signal (RB) is entered by the sampling clock (CK).

Figure 6:
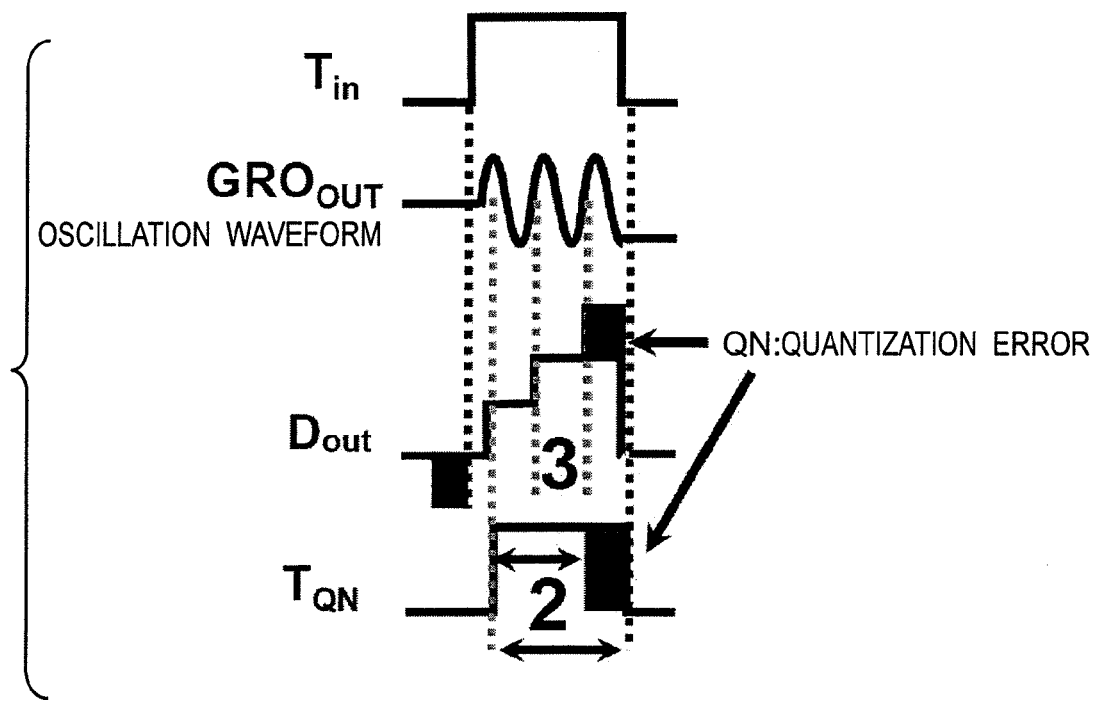
FIG. 6 is a second explanatory diagram of the error propagation circuit part.

FIG. 6 shows an operation timing of the Delay type flip-flop that operates as the error propagation circuit part. When the width of the pulse that temporally changes is inputted ($T_{in}$) from the VT converter circuit part to the GRO, the output oscillation waveform ($GRO_{out}$) is outputted from the GRO. The output oscillation waveform ($GRO_{out}$) is supplied as an input to the counter circuit part and a clock input to the Delay type flip-flop. In the counter circuit part, the number of waves of the output oscillation waveform ($GRO_{out}$) is counted, and the counted value ($D_{out}$) is outputted. Moreover, the signal state of "1" of the input D is outputted from the output Q of the Delay type flip-flop. The counted value ($D_{out}$) and the pulse width ($T_{QN}$) of the output of "1" of the Delay type flip-flop contain a quantization error (QN) and are expressed by the following Equation 1. In this case, $T_{QN}$ contains the oscillation frequency $D_{out}$ of the $GRO_{out}$ and QN. Moreover, it is necessary to subtract "one" from this since the first rise of $D_{out}$ is subtracted, and the subtraction process should properly be performed in the output signal generator part of the subsequent stage.

$$T_{QN}=D_{out}-1+QN \quad (1)$$

Figure 14:
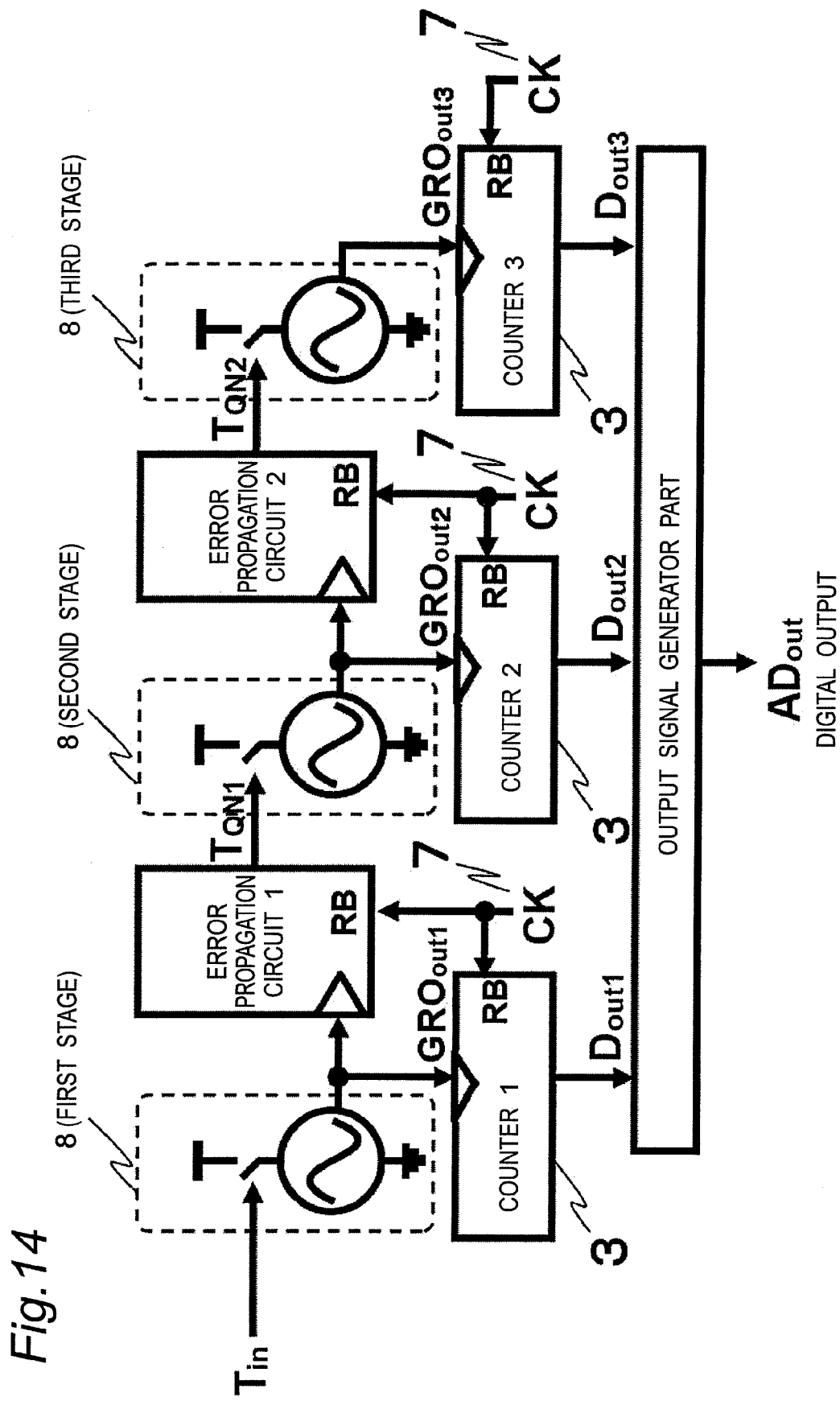
FIG. 14 is a functional block diagram of the TD converter of the present invention.

FIG. 14 shows a functional block diagram of the TD converter of the present invention. The TD converter differs from the aforementioned functional block diagram (FIG. 3) of the AD converter of the present invention in the presence or absence of the VT converter circuit part.

Figure 15:
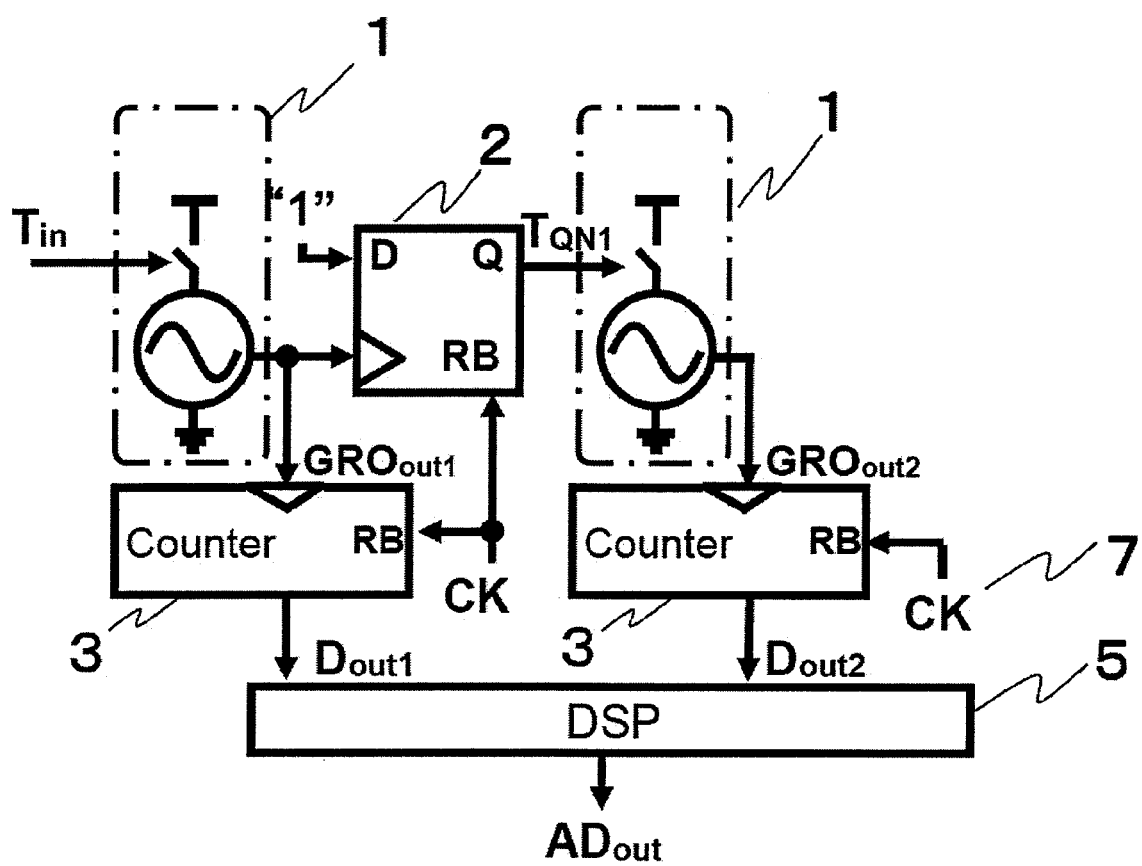
FIG. 15 is a circuit configuration diagram of the TD converter of the present invention.

FIG. 15 shows a concrete circuit configuration of a TD converter configured to include GRO circuit parts of two stages as one example of the TD converter of the present invention. The TD converter differs from the circuit configuration diagram (FIG. 4) of the AD converter of the present invention in the presence or absence of the VT converter circuit part and the calibration circuit part of the VT conversion characteristic.

IMPLEMENTAL EXAMPLE

Next, in the implemental example, one embodiment of the VT converter circuit part in the AD converter of the present invention is described.

Figure 7:
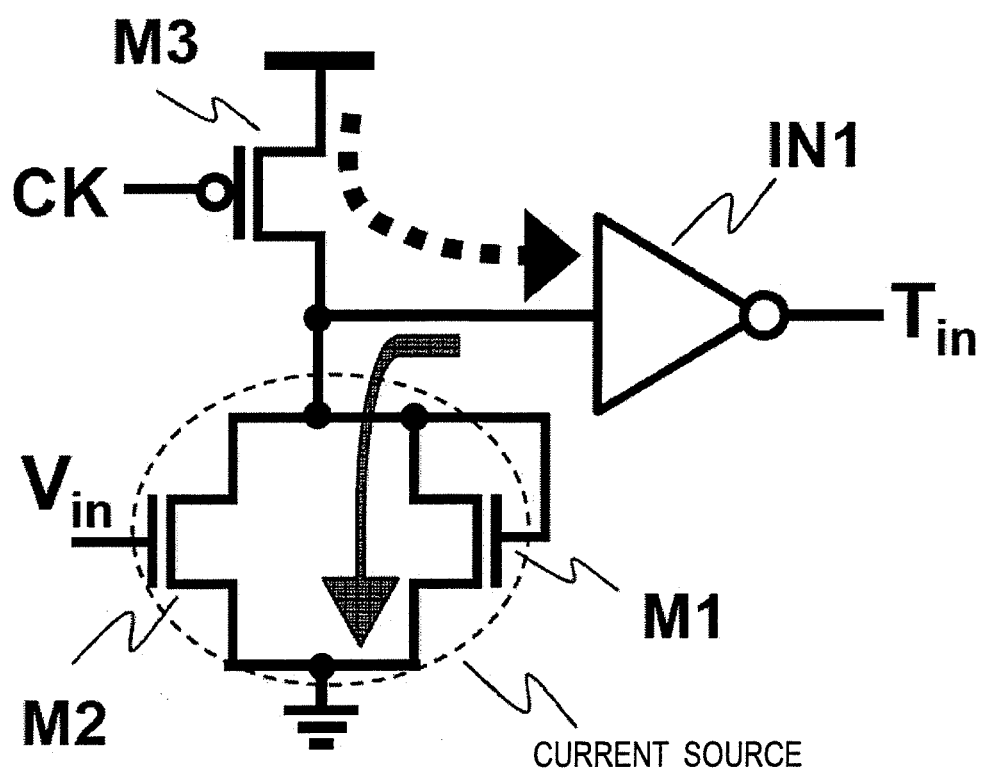
FIG. 7 is a circuit configuration diagram and an operation explanation diagram of the VT converter circuit part of an implemental example.
Figure 9:
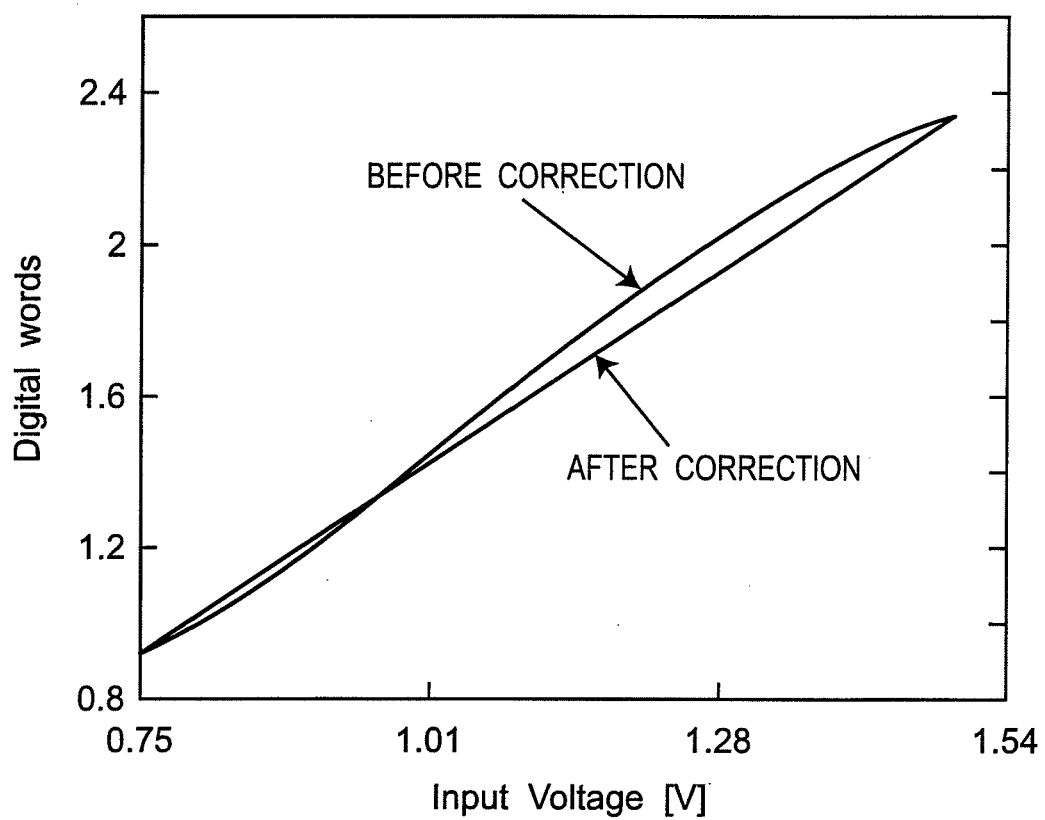
FIG. 9 is a graph showing a VT conversion characteristic of the VT converter circuit part of the implemental example.

FIG. 7 shows a circuit configuration diagram and the operation explanation diagram of the VT converter circuit part of the implemental example. FIG. 9 shows a graph showing a VT conversion characteristic of the VT converter circuit part of the implemental example.

Referring to FIG. 7, the VT converter circuit part is configured to include the following:

(a) an inverter IN1;

(b) first and second MOS transistors M1 and M2, which are inserted in parallel between the input node of an inverter IN1 and the reference voltage node, where the gate and drain of the first MOS transistors are connected to each other, and the gate of the second MOS transistor M2 is supplied with an input voltage signal ($V_{in}$); and (c) a third MOS transistor M3, which is inserted between the input node of the inverter IN1 and the power voltage node, where the gate of the third MOS transistor is supplied with the sampling clock (CK), and is able to output time domain data ($T_{in}$) from the output node of the inverter IN1.

Each of the first MOS transistor M1 and the second MOS transistor M2 are configured of NMOS transistor, and the third MOS transistor M3 is configured of PMOS transistor Electric charges accumulated in the drain are pulled out by the NMOS that serves as the current source side. Electric charges are supplied when the sampling clock (CK) is the Low level, and the inverter IN1 outputs the Low level signal. When the sampling clock (CK) becomes the High level and the electric charge supply stops, the NMOS side pulls out electric charges at a certain speed, and the inverter outputs the High level signal toward the NMOS side where the gate voltage falls below the threshold value. The pull-out speed changes depending on the input voltage signal ($V_{in}$), and this leads to achievement of the VT conversion. With this configuration, reset takes effect without fail at the timing of each sampling clock (CK) from the PMOS side regardless of the input of the input voltage signal ($V_{in}$).

Figure 8:
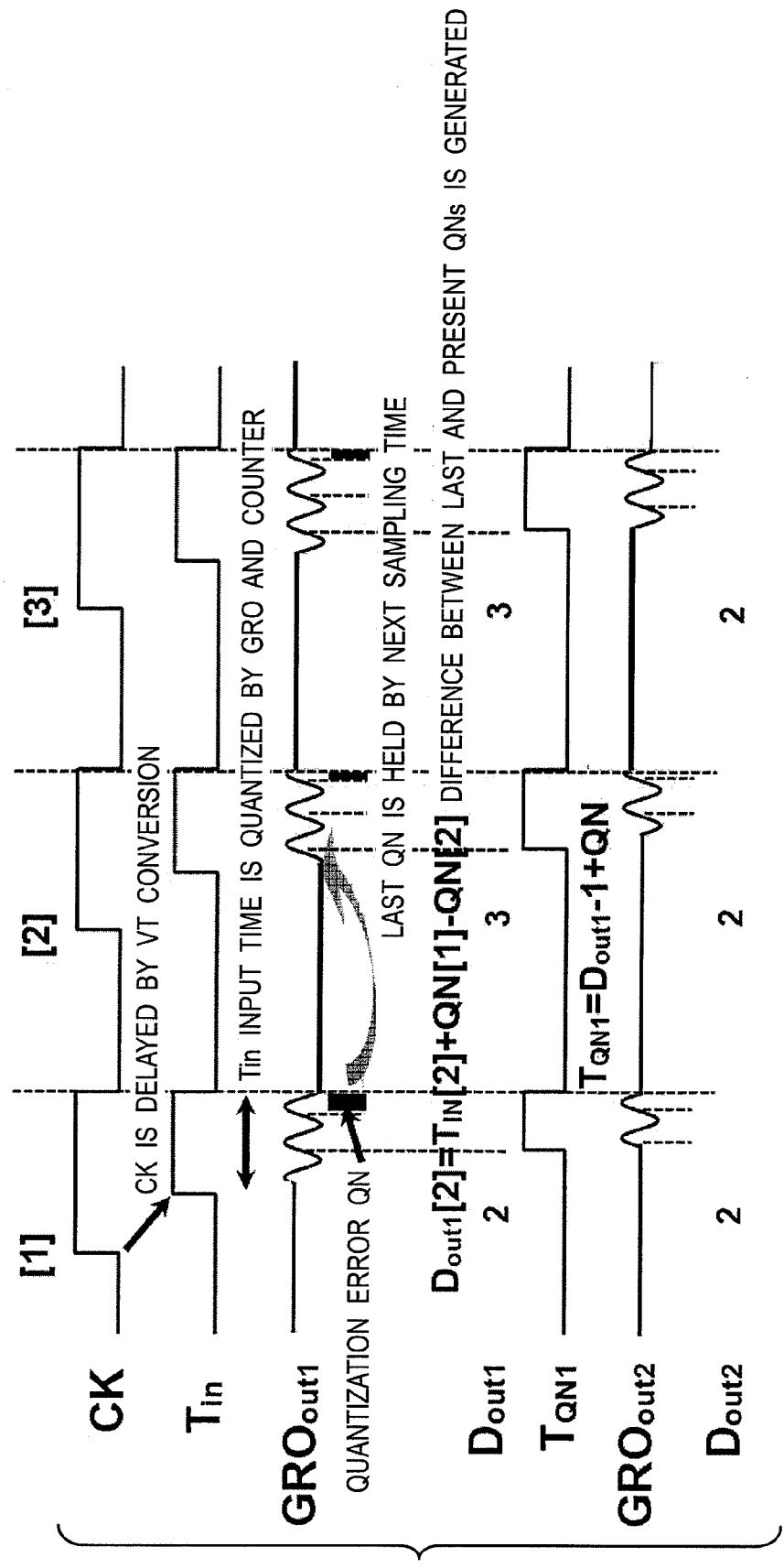
FIG. 8 is an operation timing chart of the AD converter of the implemental example.

FIG. 8 shows an operation timing chart of the AD converter (See the circuit configuration diagram of FIG. 4) employing the VT converter circuit part of the implemental example.

FIG. 8 shows a situation in which the sampling clock (CK) enters three times [1] to [3]. When the sampling clock (CK) rises, the output ($T_{in}$) of the VT converter circuit part rises such that the sampling clock (CK) is delayed by VT conversion. While the output ($T_{in}$) is raised, an output oscillation waveform ($GRO_{out1}$) is obtained from the GRO circuit part 1 of the previous stage. The output oscillation waveform ($GRO_{out1}$) is supplied as an input to the counter circuit part and a clock input to the Delay type flip-flop, and a $T_i$, input time is quantized by the GRO circuit part 1 and the counter circuit part 3. The counted value ($D_{out}1$) and the output value ($T_{QN1}$) of the Delay type flip-flop 2 contain a quantization error (QN). The last quantization error (QN) is held by the Delay type flip-flop 2 until the timing of the next sampling clock (CK). While the output value ($T_{QN1}$) of the Delay type flip-flop 2 is raised, an output oscillation waveform ($GRO_{out2}$) of the GRO circuit part of the subsequent stage is obtained.

The VT conversion characteristics shown in FIG. 9 are obtained through simulations by the SPICE (Simulation Program with Integrated Circuit Emphasis). Although the VT characteristics do not have a complete linearity, non-linearity correction is performed after a decimation filter process by a DSP taking advantage of a monotonous increase with respect to V. A coefficient necessary for the non-linearity correction is preliminarily obtained by calibration with a DC sweep signal.

The architecture of this AD converter was actually laid out by using a CMOS 40 nm process. The circuit area was 640 $\mu m^2$, and the power consumption of the whole AD converter became 583.2 µW totaling the power consumptions of 134.4 µW 100.8 µW and 348.0 µW in the VT converter circuit part, two GRO circuit parts and the logic circuit part including the Delay type flip-flop and the counter, respectively, at the operating time.

Time delay data was generated by using numerical calculation software, and evaluations of the first-order and second-order Δ-Σ modulation performances were simulated by the SPICE. The MATLAB was used as the numerical calculation software.

Figure 10A:
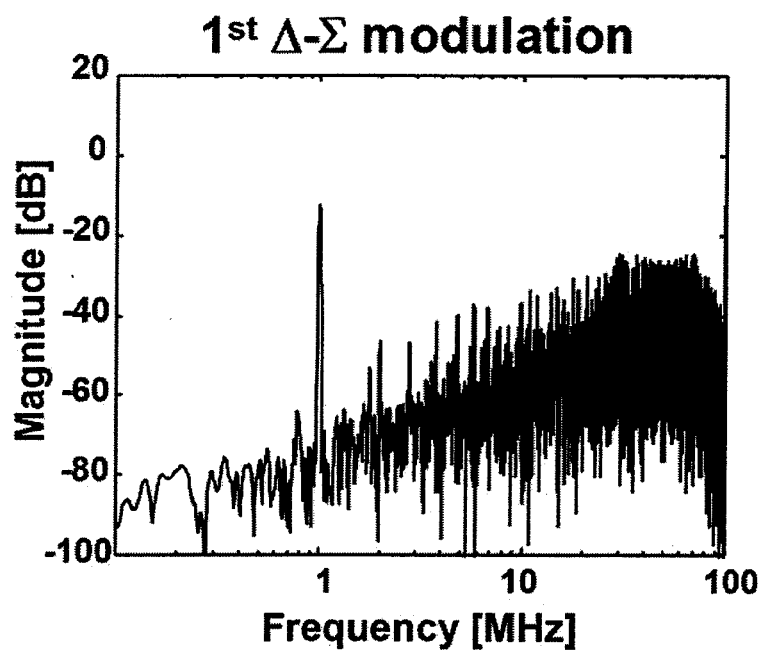
FIG. 10A is a chart of output spectrum obtained by an SPICE simulation of the AD conversion data using the VT converter circuit part of the implemental example in a case of first-order Δ-Σ modulation.
Figure 10B:
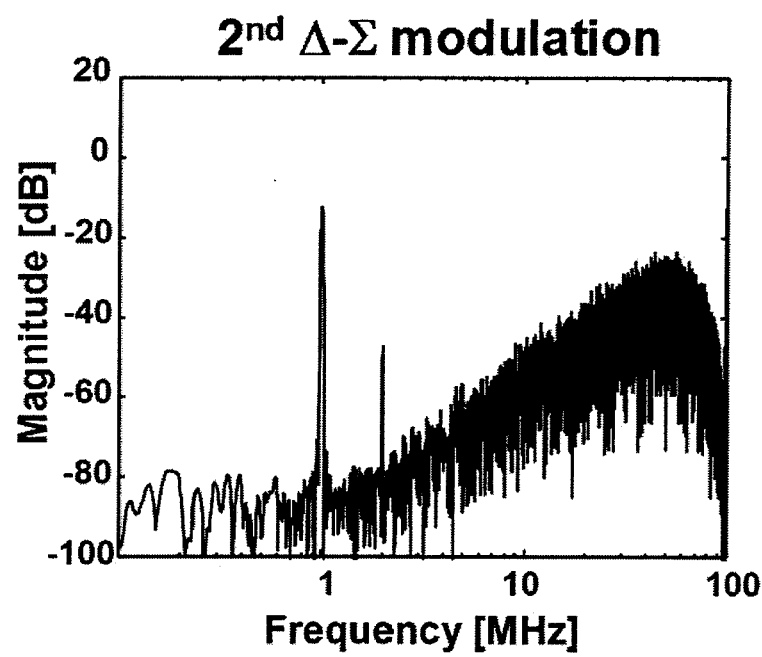
FIG. 10B is a chart of output spectrum obtained by the SPICE simulation of the AD conversion data using the VT converter circuit part of the implemental example in a case of second-order Δ-Σ modulation.

FIGS. 10A and 10B show output spectrums obtained by the SPICE simulations of the AD conversion data using the VT converter circuit part of the implemental example.

Comparing the first-order output result with the second-order output result, it could be confirmed that the noise shaping characteristic of the second-order Δ-Σ modulation exceeded the noise shaping characteristic of the first-order Δ-Σ modulation. Although the second-order higher harmonics is conspicuous, the noise is generated by a limitation in the temporal accuracy of the MATLAB.

Figure 11A:
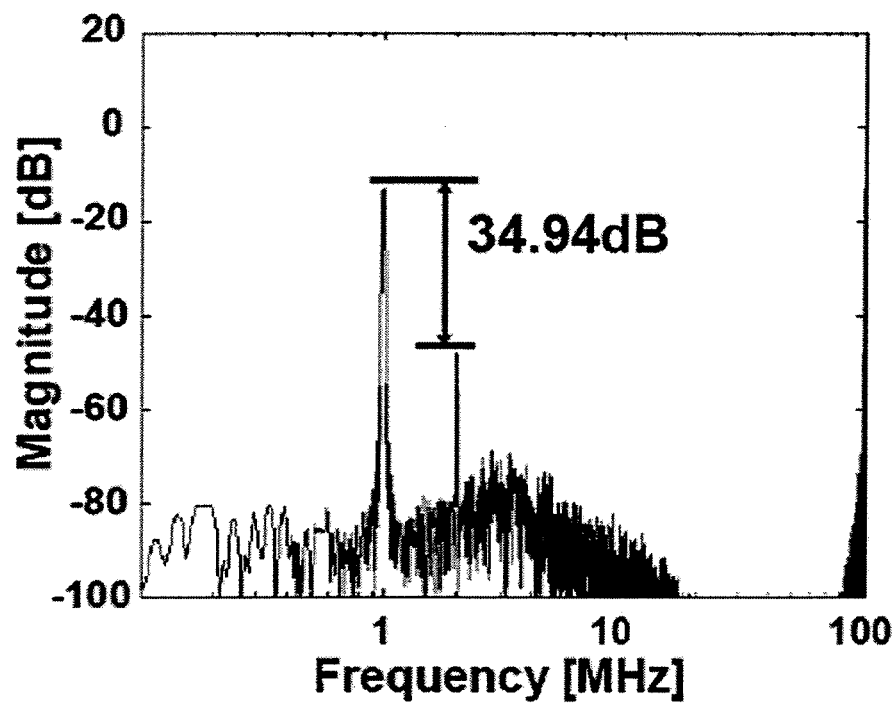
FIG. 11A is a chart of output spectrum as decimated results after AD conversion in an uncorrected case.
Figure 11B:
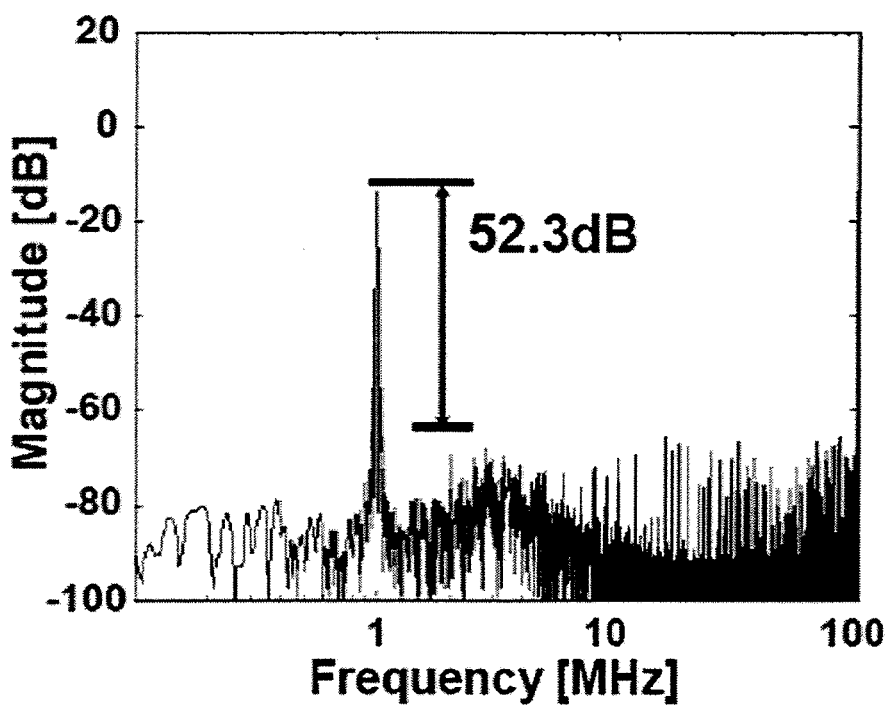
FIG. 11B is a chart of output spectrum as decimated results after AD conversion in a corrected case.

FIGS. 11A and 11B show the output spectrums of the simulation results decimated after AD conversion. No non-linearity correction of the VT converter circuit part is performed in the case of (a), and the non-linearity correction of the VT converter circuit part is performed in the case of (b). In contrast to the fact that the SFDR (Spurious-Free Dynamic Range) is 34.94 (dB) in the case of (a) before connection, the SFDR is 52.3 (dB) in the case of (b) after correction. It could be confirmed that the SFDR was improved by 17.36 (dB) by performing the non-linearity correction. An SNDR of 45 (dB) could be achieved after correction.

Figure 12:
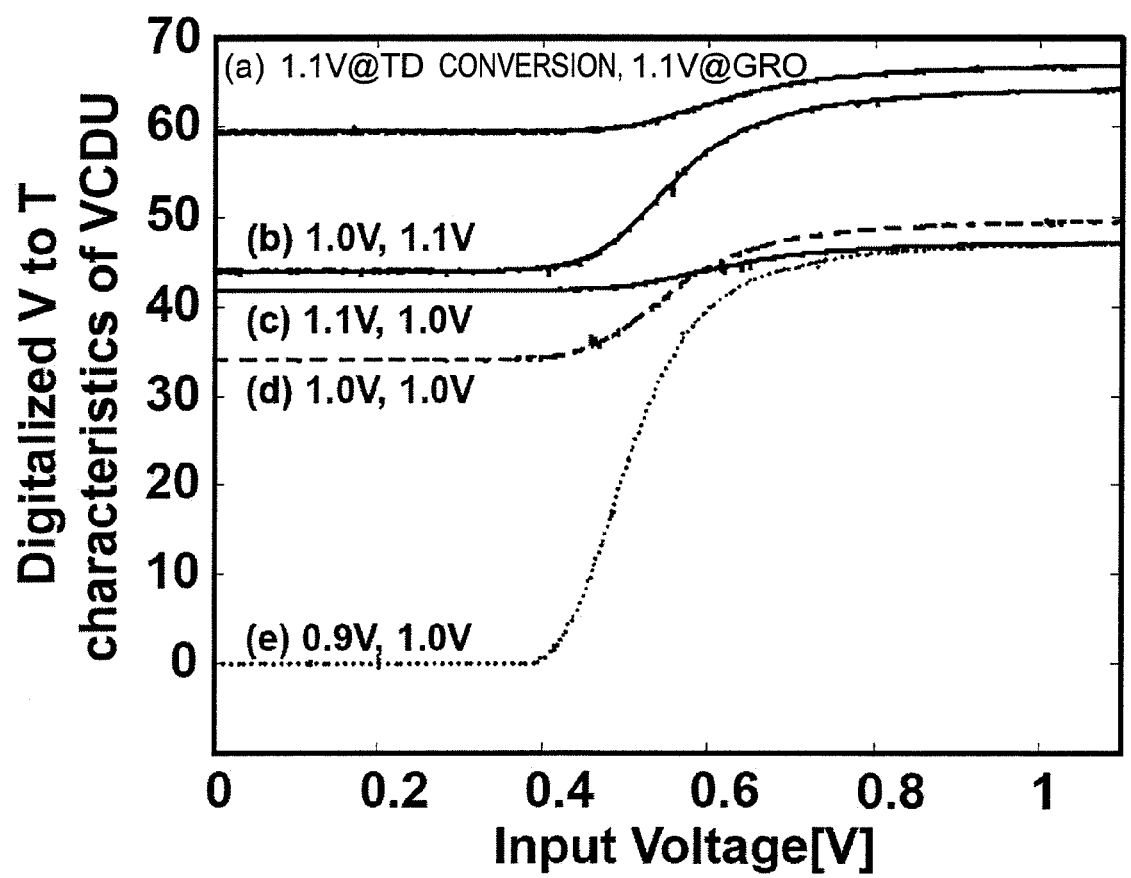
FIG. 12 is a graph showing a second VT conversion characteristic of the VT converter circuit part of the implemental example.

FIG. 12 shows actually measured characteristics when the input of the VT converter circuit part of the implemental example is subjected to DC sweep. Judging from the fact that the VT conversion characteristic monotonously increases in each case of the power voltage of 0.8 to 1.1 (V), it can be understood that the dynamic range ranges from 0.4 to 1.1 (V). Regarding the digital output value of the AD converter when the power voltage of the VT converter circuit part is changed, a result that the gain of the VT conversion rises when the power voltage of the VT converter circuit part is lowered, and the gain of the VT conversion falls when the power voltage of the VT converter circuit part is conversely raised can be confirmed.

On the other hand, since the oscillation frequency of the GRO circuit part increases when the power voltage of the GRO circuit part is raised, the gain of the VT conversion rises. Referring to FIG. 12, it can be understood that the characteristic in the case (e) where a power voltage of 0.9 (V) is applied to the VT converter circuit part and a power voltage of 1 (V) is applied to the GRO circuit part has the highest conversion gain.

A list of power consumptions when the power voltage is changed from 0.8 (V) to 1.1 (V) is shown by actual measurement in Table 1 below. Since a heavier load is imposed on the counter circuit part because of an increase in the oscillation frequency of the GRO circuit part as the voltage is higher, and in addition, the power consumption of the logic circuit part greatly rises because of an increase in the processing bit count. It can be understood that the power consumption of the VT converter circuit part, which is the analog block in the AD converter of the implemental example, is small as a ratio to the whole. Since almost the entire power consumption is shared by the logic circuit part, an influence due to scaling is large, and a configuration suitable for a small area, low power consumption and a minute process can be actualized.

TABLE 1

| Supply Voltage (V) | 1.1 | 1 | 0.9 | 0.8 |
| --- | --- | --- | --- | --- |
| GRO Circuit Part | 49.8 | 31.7 | 16 | 6.7 |
| VT Converter Circuit Part | 14.3 | 9.6 | 5.4 | 2.9 |
| Logic Circuit Part | 307.3 | 199.2 | 98.2 | 49.8 |
| Sum Total (V) | 371.4 | 240.5 | 119.6 | 59.4 |

Figure 13A:
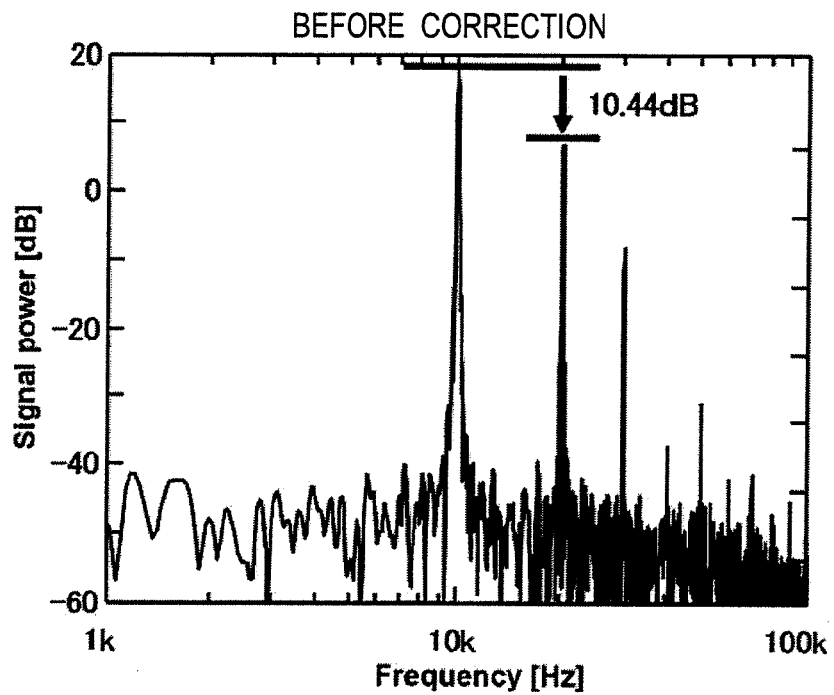
FIG. 13A is a chart of output spectrum before correction matched to the characteristic of the VT converter circuit part of the implemental example.
Figure 13B:
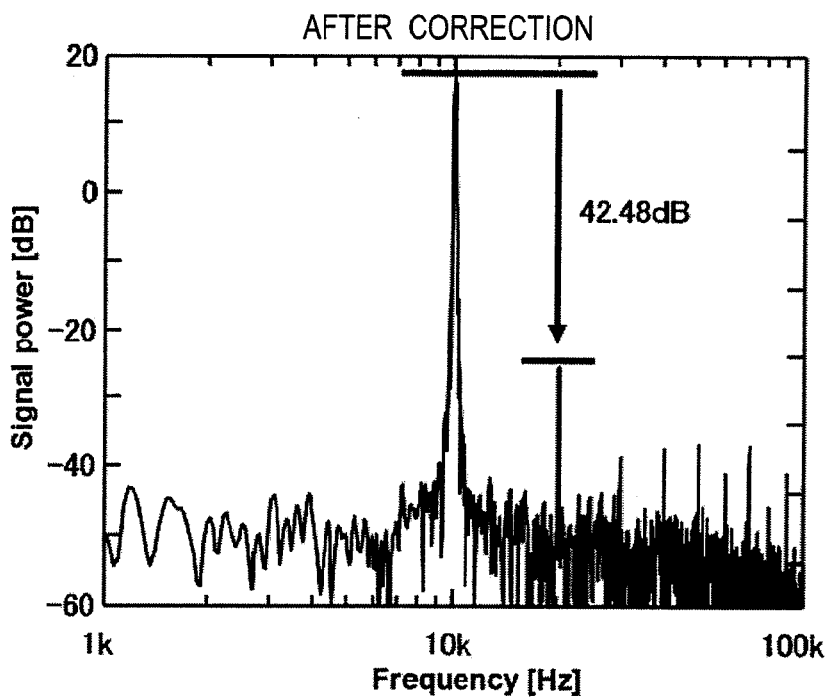
FIG. 13B is a chart of output spectrum after correction matched to the characteristic of the VT converter circuit part of the implemental example.

FIGS. 13A and 13B show actually measured output spectrums after correction match to the characteristic of the VT converter circuit part of the implemental example. The measurements were performed in a state in which the VT conversion characteristic had the highest gain on the measurement conditions of a sampling frequency of 5 (MHz), an input frequency of 10 (kHz), a power voltage of 0.9(V) of the VT converter circuit part, and a power voltage of 1.0 (V) of the GRO. The second-order higher harmonics and the third-order higher harmonics were lowered than before correction, and improvements were observed. However, the result showed that some second-order components remain. The SFDR value at this time is 42.48 (dB). Moreover, SNR is 38.69 (dB). Since some hysteresis components were observed in the result of obtaining the VT conversion characteristic of the VT converter circuit part, filtering and smoothing processes were performed in the output signal generator part in order to remove the hysteresis components in the VT conversion characteristic at the time of the correction process.

The present invention is useful for AD converters and TD converters. Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An AD converter comprising:
a VT converter circuit part configured to input an analog input voltage and a sampling clock (CK), convert the analog input voltage to a corresponding delay time, and output time domain data;
a ring oscillator circuit part of a plurality of N stages configured to input the time domain data;
an error propagation circuit part being inserted between a ring oscillator circuit part of a previous stage and a ring oscillator circuit part of a next stage, the error propagation circuit part taking out delay information containing a quantization error from phase information of the ring oscillator circuit part of the previous stage, and propagating the delay information to the ring oscillator circuit part of a subsequent stage;
a counter circuit part configured to measure a number of waves of an output oscillation waveform of the ring oscillator circuit part of each stage;
an output signal generator part configured to generate an output signal from an output counted value of each counter circuit part; and
a reset part configured to reset each error propagation circuit part and each counter circuit part with a sampling clock (CK).

2. The AD converter as claimed in claim 1,
wherein the error propagation circuit part detects rise of the output oscillation waveform from the ring oscillator circuit part of the previous stage, obtains the time domain data containing the quantization error, and thereafter subtracts the counted value of the number of waves of the output oscillation waveform of the ring oscillator circuit part of the previous stage, thereby transmitting the quantization error.

3. The AD converter as claimed in claim 1,
wherein the error propagation circuit part is configured to include a Delay type flip-flop circuit.

4. The AD converter as claimed in claim 1,
wherein the ring oscillator circuit part is a Gated Ring Oscillator (GRO) circuit.

5. The AD converter as claimed in claim 1,
wherein the output signal generator part comprises a decimation filter circuit, and performs smoothing by performing a decimation filter process for the output signal.

6. The AD converter as claimed in claim 1,
wherein the VT converter circuit part comprises:
an inverter;
first and second MOS transistors being inserted in parallel between an input node of the inverter and a reference voltage node, a gate and a drain of the first MOS transistor being connected to each other, a gate of the second MOS transistor being supplied with an input voltage signal; and
a third MOS transistor being inserted between the input node of the inverter and a power voltage node, a gate of the third MOS transistor being supplied with the sampling clock (CK), and
wherein the VT converter circuit part outputs the time domain data from an output node of the inverter.

7. The AD converter as claimed in claim 6,
wherein the output signal generator part further comprises:
a decimation filter circuit; and
a calibration circuit of the VT converter circuit part, and
non-linearity correction is performed by using the calibration circuit for output data after a decimation filter process by the output signal generator part.

8. A TD converter comprising:
a ring oscillator circuit part of a plurality of N stages configured to input time domain data;
an error propagation circuit part being inserted between a ring oscillator circuit part of a previous stage and a ring oscillator circuit part of a next stage, the error propagation circuit part taking out delay information containing a quantization error from phase information of the ring oscillator circuit part of the previous stage, and propagating the delay information to the ring oscillator circuit part of the subsequent stage;
a counter circuit part configured to measure a number of waves of an output oscillation waveform of the ring oscillator circuit part of each stage;
an output signal generator part configured to generate an output signal from an output counted value of each counter circuit part; and
a reset part configured to reset each error propagation circuit part and each counter circuit part at input signal timing of the ring oscillator circuit part, thereby converting a delay time value into a digital value.

9. The TD converter as claimed in claim 8,
wherein the error propagation circuit part detects rise of the output oscillation waveform from the ring oscillator circuit part of the previous stage, obtains the time domain data containing the quantization error, and thereafter subtracts the counted value of the number of waves of the output oscillation waveform of the ring oscillator circuit part of the previous stage, thereby transmitting the quantization error.

10. The TD converter as claimed in claim 8,
wherein the error propagation circuit part is configured to include a Delay type flip-flop circuit.

11. The TD converter as claimed in claim 8,
wherein the ring oscillator circuit part is a Gated Ring Oscillator (GRO) circuit.

* * * * *